United States Patent
Sugimoto et al.

(10) Patent No.: US 6,621,194 B1
(45) Date of Patent: Sep. 16, 2003

(54) PIEZOELECTRIC ELEMENT HAVING THICKNESS SHEAR VIBRATION AND MOBILE COMMUNICATION DEVICE USING THE SAME

(75) Inventors: Masato Sugimoto, Osaka (JP); Tetsuro Otsuchi, Osaka (JP); Katsunori Moritoki, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/710,472

(22) Filed: Nov. 10, 2000

(30) Foreign Application Priority Data

Nov. 15, 1999 (JP) .............................. 11-324597
Apr. 25, 2000 (JP) ....................... 2000-124000

(51) Int. Cl.[7] .................. H01L 41/04; H01L 41/08; H01L 41/18; H02N 2/00
(52) U.S. Cl. ................ 310/368; 310/320; 310/360; 310/366; 310/333
(58) Field of Search .................. 310/320, 360, 310/368, 366; 333/189, 187

(56) References Cited

U.S. PATENT DOCUMENTS

| | | | |
|---|---|---|---|
| 4,126,802 A | * 11/1978 | Hermann | 310/361 |
| 4,454,444 A | 6/1984 | Fujiwara et al. | |
| 4,564,782 A | * 1/1986 | Ogawa | 310/359 |
| 4,701,661 A | * 10/1987 | Warner et al. | 310/360 |
| 5,349,857 A | * 9/1994 | Kasanami et al. | 73/505 |
| 5,446,429 A | * 8/1995 | Tanaka | 310/326 |
| 5,608,362 A | 3/1997 | Shimura et al. | |
| 5,912,524 A | * 6/1999 | Ohnishi et al. | 310/321 |
| 5,937,318 A | * 8/1999 | Warner, Jr. et al. | 438/505 |
| 6,023,973 A | * 2/2000 | Yabe et al. | 310/316.01 |
| 6,057,630 A | * 5/2000 | Yanagihara et al. | 310/313 B |
| 6,064,351 A | * 5/2000 | Mandai et al. | 343/700 MS |
| 6,084,336 A | * 7/2000 | Kawasaki et al. | 310/359 |
| 6,150,903 A | * 11/2000 | Asakawa et al. | 333/189 |
| 6,209,393 B1 | * 4/2001 | Tomikawa et al. | 73/504.12 |
| 6,243,933 B1 | * 6/2001 | Sugimoto et al. | 29/25.35 |

FOREIGN PATENT DOCUMENTS

| | | |
|---|---|---|
| JP | 63-57967 | 11/1988 |
| JP | 1-36724 | 8/1989 |
| JP | 3-3514 | 1/1991 |
| JP | 6-303090 | 10/1994 |
| JP | 7-206600 | 8/1995 |

* cited by examiner

Primary Examiner—Nestor Ramirez
Assistant Examiner—Julio C. Gonzalez
(74) Attorney, Agent, or Firm—Merchant & Gould P.C.

(57) ABSTRACT

A piezoelectric element includes a piezoelectric substrate formed of a piezoelectric material and a pair of electrodes formed on a first principal plane and a second principal plane of the piezoelectric substrate, wherein thickness shear vibration occurs, and the vibration direction of the thickness shear vibration is nonparallel to the side walls of the piezoelectric substrate.

15 Claims, 9 Drawing Sheets

PIEZOELECTRIC ELEMENT HAVING THICKNESS SHEAR VIBRATION AND MOBILE COMMUNICATION DEVICE USING THE SAME

BACKGROUND OF THE INVENTION

1. Field of the Invention

The present invention relates to a piezoelectric element and a mobile communication device using the same.

2. Description of the Prior Art

The recent trends of speeding up information processing terminals and digitalization of communication require compact and high frequency vibrators and compact and wide band intermediate frequency filters. For these piezoelectric elements, energy trapping piezoelectric elements conventionally have been used, but the recent trends require more compact and wider band piezoelectric elements.

Crystal filters are used most widely as the energy trapping piezoelectric filters. However, it is difficult to form a wide band filter with quartz, because the material has a small electromechanical coupling factor.

For this reason, piezoelectric single crystals or piezoelectric ceramics that have a large electromechanical coupling factor are used for these applications. Among the piezoelectric single crystals, an X-cut $LiTaO_3$ single crystal, which has a high Q of vibration and excellent temperature characteristics, is used most commonly.

$LiTaO_3$ single crystal has large piezoelectricity and is suitable for a wide band filter, but undesired vibration tends to be excited so that large spurious (spurious response) is likely to occur. Therefore, thickness shear vibration having relatively small spurious is used as the vibration mode. The thickness shear vibration refers to vibration whose displacement direction is substantially identical to its propagation direction. Thickness twist vibration whose propagation direction is perpendicular to its displacement direction also is excited in the $LiTaO_3$ single crystals, which also causes spurious. Furthermore, reflections of these vibrations at the end faces of oscillating elements also cause spurious.

In order to reduce the influence of the reflections at the end faces of the thickness shear vibration and the thickness twist vibration for further compact piezoelectric vibrators, a method for forming a piezoelectric vibrator in a strip has been known.

When using a X plate of $LiTaO_3$ single crystal as a substrate of a strip vibrator, a substrate that is cut in a direction of $-50°\pm2°$ from the Y-axis has the lowest resonance impedance, and therefore usually this direction is used as the displacement direction of vibration. FIG. 8 is a plan view of an example of such a conventional $LiTaO_3$ piezoelectric vibrator.

Referring to FIG. 8, a conventional piezoelectric vibrator 1 includes a piezoelectric substrate 2 formed of $LiTaO_3$ and a pair of exciting electrodes 3 formed on one principal plane and another principal plane of the piezoelectric substrate 2. In FIG. 8, an electrode for interconnection is not shown. As shown in FIG. 8, in the conventional $LiTaO_3$ resonator in general, the piezoelectric substrate is cut in such a manner that the displacement direction of the thickness shear vibration corresponds to the longitudinal direction, and the exciting electrodes 3 are formed along the entire width in the traverse direction of the piezoelectric substrate 2.

In this vibrator, it is necessary to cut a substrate into a strip with a small width (about several times the thickness) in order to avoid undesired vibration in connection with the width. Therefore, when the direction in which the substrate is cut is significantly different from the direction of the cleavage of the crystal, the element is broken readily in the cleavage direction when cutting the substrate. Thus, miniaturization was difficult. Moreover, if chipping occurs in a cut plane, the chipping on the cut plane causes spurious. Thus, it was difficult to form a high precision vibrator or filter that operates at high frequencies.

As an attempt to solve this problem, a piezoelectric vibrator employing a piezoelectric substrate cut in the direction $-57°$ from the Y-axis was proposed (see JP 6-303090A). The cleavage plane of the X plate of $LiTaO_3$ single crystal is in the direction $-57°$ from the Y-axis, and therefore cutting along this cleavage plane can improve the processability.

However, there is still a problem in that the spurious caused by the shape of the element is likely to occur even if the piezoelectric substrate cut in the direction $-57°$ from the Y-axis is used.

SUMMARY OF THE INVENTION

Therefore, with the foregoing in mind, it is an object of the present invention to provide a piezoelectric element that can suppress undesired spurious and allows operations at high frequencies, and to provide a mobile communication device using the same.

A piezoelectric element of the present invention includes a piezoelectric substrate, and a pair of electrodes formed on at least one principal plane selected from the group consisting of a first principal plane of the piezoelectric substrate and a second principal plane opposed to the first principal plane, wherein thickness shear vibration occurs, and the vibration direction of the thickness shear vibration is nonparallel to a side wall of the piezoelectric substrate. In the piezoelectric element of the present invention, undesired vibration such as thickness twist vibration can be suppressed, substantially without affecting the thickness shear vibration. Therefore, according to the above-described piezoelectric element, undesired spurious can be suppressed.

In the above-described piezoelectric element, it is preferable that the piezoelectric substrate has a shape of an elongated rectangular solid, and each of the pair of electrodes is formed along the entire width in the traverse direction on the at least one principal plane. This embodiment provides a strip-type piezoelectric element that allows miniaturization. In this specification, the traverse direction refers to a direction perpendicular to the longitudinal direction of the elongated rectangular solid-shaped substrate.

In the above-described piezoelectric element, it is preferable that the piezoelectric substrate is formed of $LiTaO_3$ single crystal, the pair of electrodes includes a first exciting electrode and a second exciting electrode, the first exciting electrode is formed on the first principal plane, the second exciting electrode is formed on the second principal plane, the side wall is a side wall in the longitudinal direction of the piezoelectric substrate, and the normal line of an edge of the first exciting electrode and the normal line of an edge of the second exciting electrode are parallel to each other and are nonparallel to the side wall in the longitudinal direction. This embodiment provides a piezoelectric vibrator that can be produced easily, has particularly small spurious, and allows operations at high frequencies. In this specification, the side wall in the longitudinal direction refers to a principal plane adjacent to the first principal plane in the traverse direction In the above-described piezoelectric element, it is preferable that the first and second principal planes are X planes of the piezoelectric substrate, and the side wall in the longitudinal direction is parallel to a plane obtained by rotating the XY plane of the piezoelectric substrate for 56° to 58° clockwise about the X-axis. This embodiment provides a piezoelectric vibrator that can be produced particularly easily, has even smaller spurious, and allows operations at high frequencies. In this specification, when "clockwise rotation about the X-axis" is referred to, the substrate is viewed from the plus direction of the X-axis (see FIG. 1A). The term "X plane of the substrate" as used in this specification includes substrates cut at planes that are inclined several degrees from the X plane of the substrate as equivalents.

In the above-described piezoelectric element, it is preferable that the direction of the normal line is a direction obtained by rotating the Y-axis of the piezoelectric substrate for 47° to 56° clockwise on the YZ plane. This embodiment provides a piezoelectric vibrator that has even smaller spurious.

In the above-described piezoelectric element, it is preferable that the width W and the thickness H of the piezoelectric substrate satisfy the relationship $2.9 \leq W/H \leq 3.1$ or $3.7 \leq W/H \leq 3.9$. This embodiment provides a piezoelectric vibrator with good characteristics in which the spurious that occurs in connection with the width is sufficiently apart from the frequency band of the principal vibration. In the conventional element that is cut along the cleavage direction of the substrate, spurious would occur within the frequency band of the principal vibration if the ratio of the thickness and the width is set to be in a small range from 1.5 to 2.0, and thus good characteristic cannot be obtained (see Japanese Patent NO. 2855208). On the other hand, the piezoelectric vibrator of the present invention can be provided with good characteristics even if the vibrator has a large width for easy processing. In this specification, "the width of the substrate" refers to the distance between two side walls that extend in the longitudinal direction, and "the thickness of the substrate" refers to the distance between the first principal plane and the second principal plane.

In the above-described piezoelectric element, the piezoelectric substrate may include a first piezoelectric substrate and a second piezoelectric substrate, and the first piezoelectric substrate and the second piezoelectric substrate may be stacked in such a manner that their polarization directions are opposite to each other. This embodiment provides a piezoelectric vibrator that can excite thickness shear vibration of second harmonics, which generally cannot be excited, and can be operated at even higher frequencies.

In the above-described piezoelectric element, it is preferable that the side wall in the longitudinal direction is a plane cleaved by laser irradiation. This embodiment prevents chipping and an increase of surface roughness on the cleavage plane, and thus provides a piezoelectric vibrator with good element characteristics.

In the above-described piezoelectric element, it is preferable that the piezoelectric substrate is formed of $LiTaO_3$ single crystal, the pair of electrodes includes an input electrode and an output electrode, the input electrode and the output electrode are formed on the first principal plane of the piezoelectric substrate, the piezoelectric element further comprises a ground electrode formed on the second principal plane, the side wall is a side wall in the longitudinal direction of the piezoelectric substrate, and the normal line of an edge of the input electrode and the normal line of an edge of the output electrode are parallel to each other and are nonparallel to the side wall in the longitudinal direction. This embodiment provides a piezoelectric filter that can be produced easily, has particularly small spurious, and allows operations at high frequencies.

In the above-described piezoelectric element, it is preferable that the first and second principal planes are X planes of the piezoelectric substrate, and the side wall of the piezoelectric substrate is parallel to a plane obtained by rotating the XY plane of the piezoelectric substrate for 56° to 58° clockwise about the X-axis. This embodiment provides a piezoelectric filter that can be produced easily, has even smaller spurious, and allows operations at high frequencies. In the above-described piezoelectric element, it is preferable that the direction of the normal line is a direction obtained by rotating the Y-axis of the piezoelectric substrate for 47° to 56° clockwise on the YZ plane. This embodiment provides a piezoelectric filter that has even smaller spurious.

In the above-described piezoelectric element, it is preferable that the width W and the thickness H of the piezoelectric substrate satisfy the relationship $2.9 \leq W/H \leq 3.1$ or $3.7 \leq W/H \leq 3.9$. This embodiment provides a piezoelectric filter with good characteristics.

In the above-described piezoelectric element, the piezoelectric substrate may include a first piezoelectric substrate and a second piezoelectric substrate, and the first piezoelectric substrate and the second piezoelectric substrate may be stacked in such a manner that their polarization directions are opposite to each other. This embodiment provides a piezoelectric filter that can be operated at even higher frequencies.

In the above-described piezoelectric element, it is preferable that the side wall in the longitudinal direction is a plane cleaved by laser irradiation. This embodiment prevents chipping and an increase of surface roughness on the cleavage plane, and thus provides a piezoelectric filter with good element characteristics.

A mobile communication device of the present invention includes the piezoelectric vibrator of the present invention as described above. According to the mobile communication device including the piezoelectric element of the present invention, a mobile communication device with stable reference frequency and stable operation can be obtained. The piezoelectric vibrator of the present invention hardly is affected by frequency hopping due to the spurious, and the amount of attenuation of signals outside the frequency band is large, and the insertion loss is small. Therefore, according to the mobile communication device including the piezoelectric filter of the present invention, a mobile communication device with high selectivity of signals can be obtained.

As described above, the piezoelectric element of the present invention can provide a piezoelectric device that has even less spurious than a conventional piezoelectric element and allows operations at high frequencies. The present invention can provide a piezoelectric element suitable for a mobile communication device or information equipment.

Furthermore, the mobile communication device using the piezoelectric vibrator of the present invention can provide a compact and high-speed mobile communication device with high operation frequency.

The piezoelectric filter of the present invention hardly is affected by frequency hopping due to spurious, and the amount of attenuation of signals outside the frequency band is large, and the insertion loss is small. Therefore, according to the mobile communication device including the piezoelectric filter of the present invention, a mobile communication device with high selectivity of signals can be obtained.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of embodiments with reference to the accompanying drawings.

EMBODIMENT 1

Figure 1A:
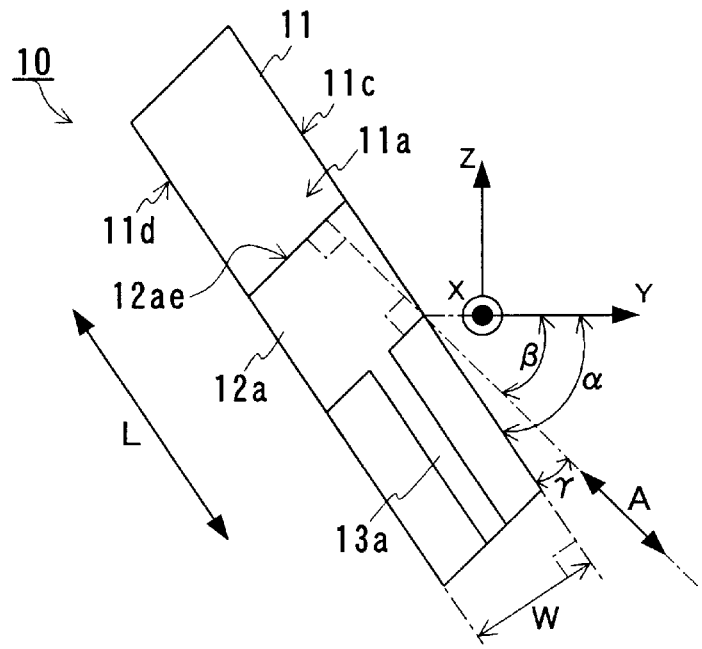
FIGS. 1A to 1C are views showing an example of a piezoelectric vibrator of the present invention.
Figure 1B:
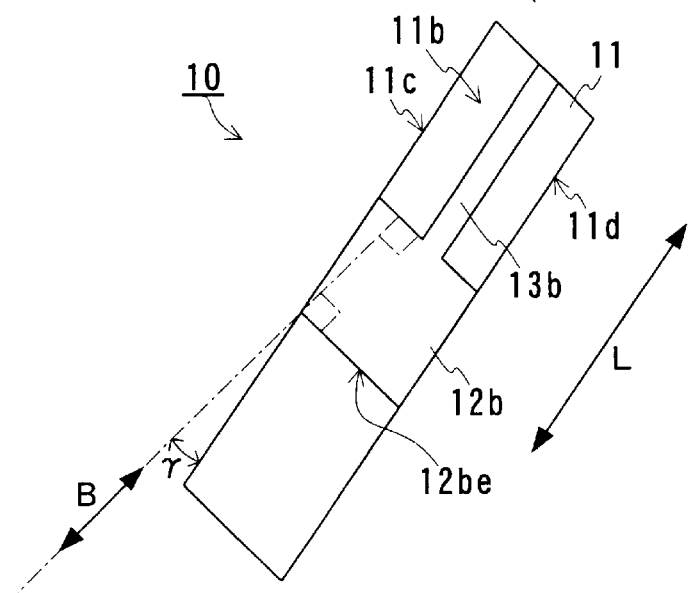
Figure 1C:
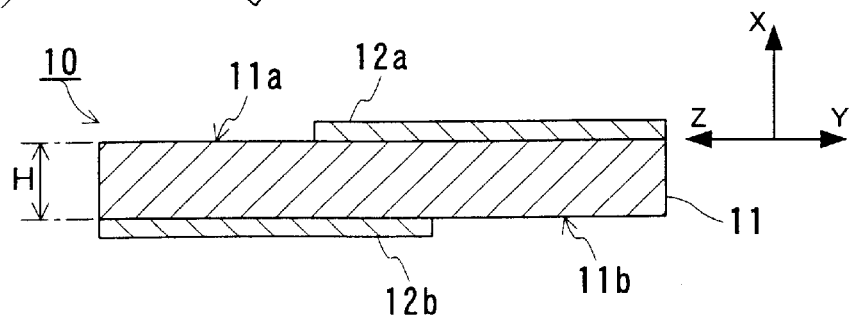

In Embodiment 1, an example of a piezoelectric vibrator will be described as a piezoelectric element of the present invention. FIG. 1A is a plan view of a piezoelectric vibrator 10 of Embodiment 1 from a first principal plane side. FIG. 1B is a plan view from a second principal plane side. FIG. 1C is a cross-sectional view of the central portion in the longitudinal direction of the element. FIGS. 1A and 1C also show the directions of the crystalline axes of a piezoelectric substrate 11.

Referring to FIGS. 1A to 1C and FIGS. 9A and 9B, the piezoelectric vibrator 10 includes a piezoelectric substrate 11 and a pair of exciting electrodes 12a and 12b formed on the piezoelectric substrate 11. The exciting electrodes 12a and 12b are connected to electrodes 13a and 13b for interconnection, respectively. The electrodes for interconnection can be formed along the entire width in the traverse direction of the piezoelectric substrate 11, as shown in FIGS. 3A to 3F.

The materials for the exciting electrodes 12a and 12b are not limited to particular materials. For example, a multilayer including a chromium layer and a gold layer can be used. The exciting electrodes 12a and 12b can be formed by a vacuum film-forming method such as vacuum evaporation. The exciting electrode 12a is formed on a first principal plane 11a of the piezoelectric substrate 11. The exciting electrode 12b is formed on a second principal plane 11b that is opposed to the first principal plane 11a. The exciting electrodes 12a and 12b with a substantially equal size are formed substantially symmetrically with the piezoelectric substrate 11 interposed therebetween. In other words, the exciting electrode 12a is formed in a position opposed to the exciting electrode 12b. In the piezoelectric vibrator 10, thickness shear vibration can be excited by applying an alternating voltage to the electrodes 12a and 12b.

The piezoelectric substrate 11 has a shape of an elongated rectangular solid. The piezoelectric substrate 11 is obtained by cutting a $LiTaO_3$ single crystal plate at the X-plane, namely, an X plate (including plates that are cut at a plane several degrees inclined from the X-plane, which also applies to the following embodiments). The first principal plane 11a and the second principal plane 11b of the piezoelectric substrate 11 are an X-cut plane and a −X-cut plane, respectively.

A side wall 11c extending in the longitudinal direction L of the piezoelectric substrate 11 and a side wall 11d in the longitudinal direction L opposed to the side wall 11c are in planes substantially parallel to the cleavage plane of the $LiTaO_3$ single crystal. Preferably, the side walls 11c and 11d are parallel to a plane obtained by rotating the XY plane of the piezoelectric substrate 11 (the X plate of the $LiTaO_3$) for 56° to 58° (57°±1°) clockwise about the X-axis. More specifically, it is preferable that the angle α formed by the side wall 11c and the Y-axis of the piezoelectric substrate 11 is 56° to 58°. Although the cleavage plane of $LiTaO_3$ single crystal is a plane substantially −57° from the Y-axis, a dislocation of about ±1° is allowable in reducing chipping sufficiently at the time of cutting (which also applies to the following embodiments). Preferably, the side walls 11c and 11d are planes cleaved by laser irradiation.

The size of the piezoelectric substrate 11 is not limited to a particular size. For example, the length can be 2.0 mm, the width can be 0.15 mm, and the thickness can be 50 μm. The piezoelectric substrate 11 with a thickness of 50 μm can provide a piezoelectric vibrator having a resonance frequency of about 40 MHz.

A substrate formed of other materials, such as $LiNbO_3$, $KNbO_3$, Langasite ($La_3Ga_5SiO_{14}$)-based materials, Langanite ($La_3Ga_{5.5}Nb_{0.5}O_{14}$)-based materials, and Langatate ($La_3Ga_{5.5}Ta_{0.5}O_{14}$)-based materials, can be used as the piezoelectric substrate 11 (which also applies to the following embodiments). Furthermore, a substrate whose first and second principal planes are substantially square can be used as the piezoelectric substrate 11 (which also applies to the following embodiments).

The direction A of the normal line of an edge 12ae of the exiting electrode 12a is substantially parallel to the direction B of the normal line of an edge 12be of the exiting electrode 12b. In other words, the exciting electrode 12a and the exciting electrode 12b are opposed to each other in the direction A.

The directions A and B are nonparallel to the cleavage plane of the $LiTaO_3$ single crystal. In other words, the direction in which the exciting electrodes 12a and 12b are opposed is nonparallel to the side walls 11c and 11d. In the piezoelectric vibrator 10 with this structure, the thickness shear vibration whose vibration direction is parallel to the direction A is excited. In other words, in the piezoelectric vibrator 10, the vibration direction of the thickness shear vibration is nonparallel to the side walls 11c and 11d.

Preferably, the directions A and B are directions obtained by rotating the Y-axis of the piezoelectric substrate 11 for 47° to 56° (preferably, 48° to 52°) clockwise on the YZ plane. More specifically, it is preferable that the angle β formed by the directions A and B and the Y-axis of the piezoelectric substrate 11 is 47° to 56°. It is preferable that the angle γ formed by the direction A and the side wall 11c of the piezoelectric substrate 11 satisfies the relationship $0° < γ \leq 10°$ (more preferably, $5° \leq γ \leq 9°$).

A conventional LiTaO₃ vibrator has a problem in that significant chipping occurs on the end face or cracks occur in the element when producing a piezoelectric substrate with a width of about 100 μm by cutting LiTaO₃. Thus, it was difficult to produce such a piezoelectric vibrator. Furthermore, even if an element could be produced, the surface roughness on the end face adversely affects the characteristics of the vibrator, and therefore it is difficult to produce a vibrator that can operate at 30 MHz or more.

However, the piezoelectric vibrator 10 of the present invention has the piezoelectric substrate 11 that is cut along the cleavage direction of the crystal. Therefore, the substrate can be divided precisely, and the surface roughness on the end face can be minimized. Therefore, the piezoelectric vibrator 10 of the present invention facilitates operations of the element at high frequencies and improves the production yield.

Furthermore, in the piezoelectric vibrator 10, the portion where the exciting electrodes 12a and 12b overlap is substantially constant in the vibration direction (direction A) of the thickness shear vibration, but has an angle with respect to the vibration direction of the thickness twist vibration (namely, the direction perpendicular to the direction A). For this reason, in the thickness twist vibration, the symmetry is broken, and undesired thickness twist vibration propagates up to the edge of the piezoelectric substrate while being reflected by the side walls of the piezoelectric substrate. The undesired vibration can be absorbed by holding the end of the element with a conductive paste or the like. Thus, the present invention can provide a piezoelectric vibrator in which undesired vibration hardly is excited, and undesired spurious is suppressed.

Figure 2A:
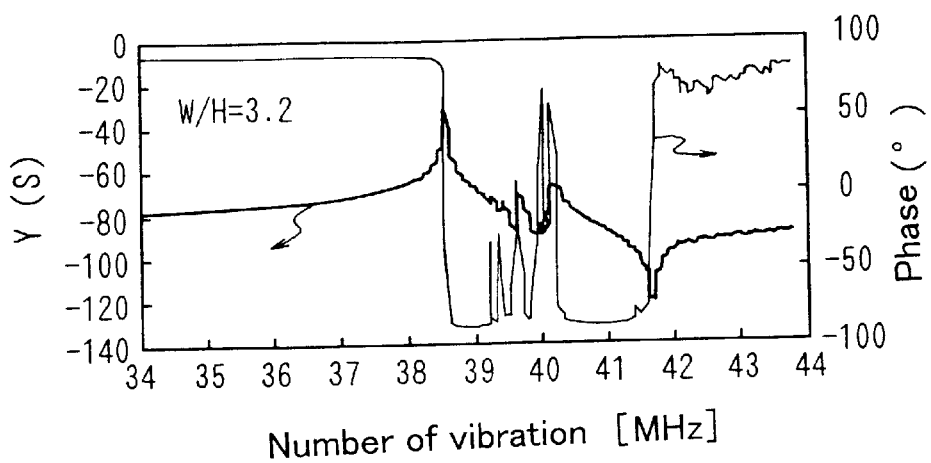
FIGS. 2A to 2C are graphs showing the frequency characteristics of the admittance and the phase of a piezoelectric vibrator of the present invention when the ratios (W/H) of the width to the thickness of the element are 3.2 (FIG. 2A), 3.8 (FIG. 2B) and 4.4 (FIG. 2C).
Figure 2B:
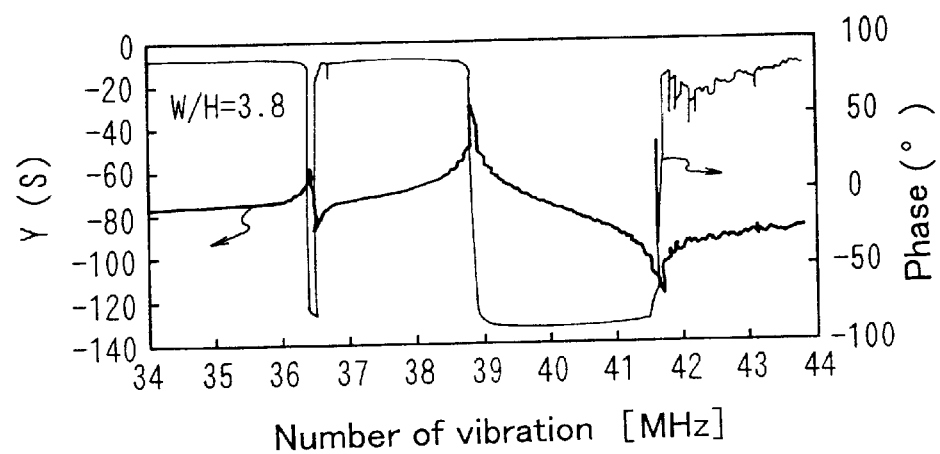
Figure 2C:
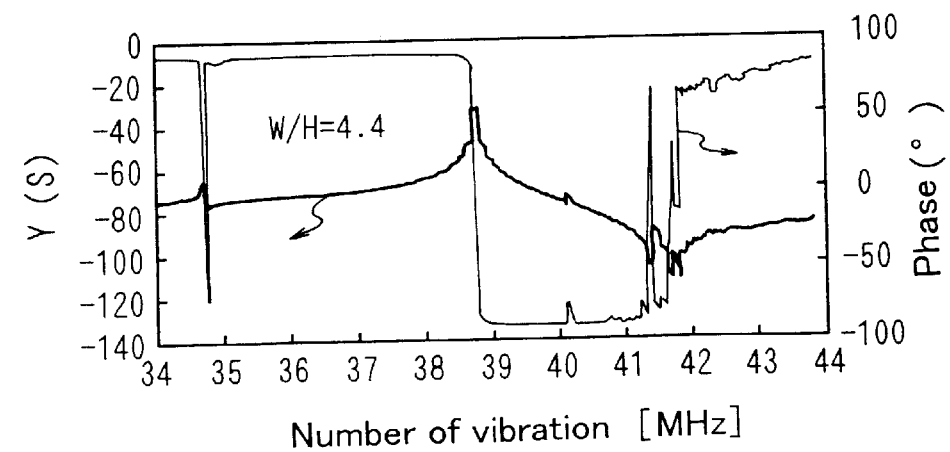

Next, the width W and the thickness H of the piezoelectric substrate 11 (see FIG. 1) will be described. The width W and the thickness H of the piezoelectric substrate 11 are correlated to the spurious. FIGS. 2A to 2C show the results of measurement of the frequency characteristics of the admittance Y(S) and the phase when varying the ratio W/H of the width W to the thickness H of the piezoelectric substrate 11. More specifically, FIG. 2A shows the case of W/H=3.2, FIG. 2B shows the case of W/H=3.8, and FIG. 2C shows the case of W/H=4.4.

In the region of W/H from 3.7 to 3.9, the spurious is not within the frequency band of the principal vibration, and only slight spurious is present on the low frequency side and the high frequency side, as shown in FIG. 2B. Thus, a piezoelectric vibrator with good characteristics can be obtained. However, as the width of the substrate is increased, the spurious approaching from the high frequency side enters the frequency band, as shown in FIG. 2C. Thus, the characteristics are deteriorated. As the width of the substrate is reduced, as shown in FIG. 2A, the spurious that is present on the low frequency side approaches, and when the spurious reaches the frequency band, the characteristics are deteriorated.

Furthermore, when the width of the substrate is reduced and W/H is smaller than 3.7, the spurious that has entered the frequency band moves gradually to the high frequency side. Then, at a certain value of W/H, the spurious moves out of the frequency band. This value of WH is in the range from 2.9 to 3.1. When the width of the substrate becomes further smaller (W/H becomes further smaller), the spurious on the low frequency side enters the frequency band again, so that the characteristics are deteriorated. Furthermore, when an element is produced at W/H of not more than 2, it is difficult to produce a high frequency element (i.e., an element having a thin thickness). On the other hand, in the range of a ratio W/H of more than 3.9, the spurious on the low frequency side and the spurious on the high frequency side approach each other so closely that the distance from the former to the latter is equal to the frequency band or less. Therefore, the spurious is always present in the frequency band at any ratio within this range of W/H. An element with higher characteristics can be obtained by producing an element at a ratio range in which the spurious on the high frequency side and the spurious on the low frequency side are not within the frequency band in view of the above results. More specifically, when the width W and the thickness H of the piezoelectric substrate 11 satisfy the relationship $2.9 \leq W/H \leq 3.1$ or $3.7 \leq W/H \leq 3.9$, a piezoelectric element with good characteristics can be obtained in which the spurious that occurs in connection with the width is sufficiently apart from the frequency band of the principal vibration (which applies to the piezoelectric vibrators and the piezoelectric filters of the following embodiments).

Figure 3A:
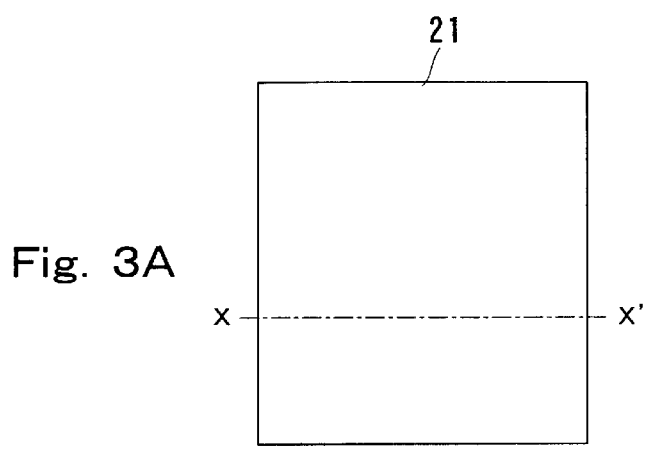
FIGS. 3A to 3F are views showing an example of a method for producing a piezoelectric vibrator of the present invention.
Figure 3D:
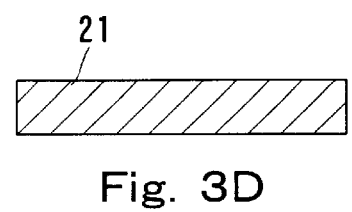
Figure 3B:
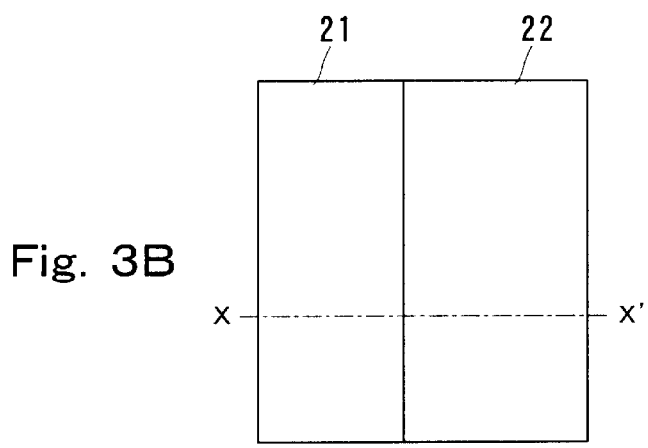
Figure 3E:
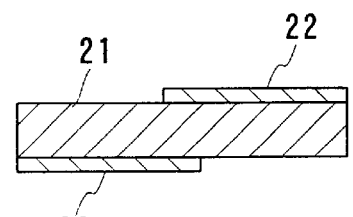
Figure 3C:
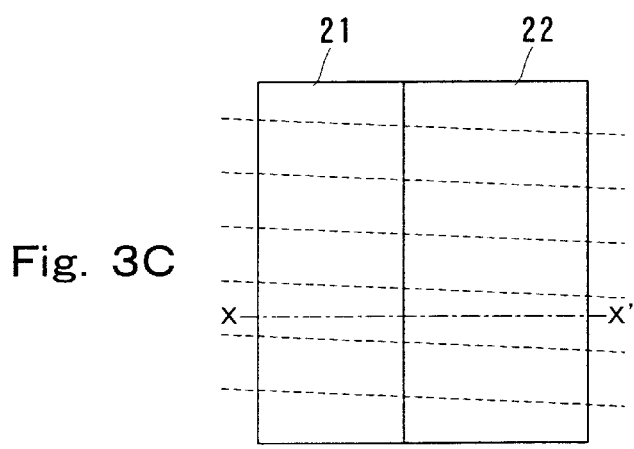
Figure 3F:
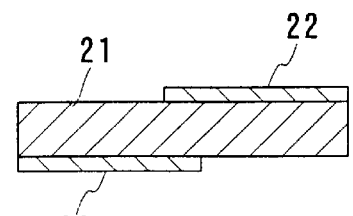

Hereinafter, an example of a method for producing the piezoelectric vibrator 10 shown in Embodiment 1 will be described. FIGS. 3A to 3C are plan views showing a process sequence. FIGS. 3D to 3F are cross-sectional views taken along lines X-X' of FIGS. 3A to 3C, respectively.

First, as shown in FIGS. 3A and 3D, a piezoelectric substrate 21 having a thickness of 50 μm that becomes the piezoelectric substrate 11 is formed in such a manner that its opposing principal planes are substantially parallel. In general, the size of the piezoelectric substrate 21 is determined depending on the thickness of the substrate. When the thickness of the piezoelectric substrate 21 is about 50 μm, it is preferable that the size of the substrate is not more than 2 inches in view of the yield. A substrate as thin as about 50 μm also can be handled easily by making the size of the substrate be not more than 2 inches.

Next, as shown in FIGS. 3B and 3E, metal films 22 that become the exciting electrodes 12a and 12b are formed on one principal plane and another principal plane of the piezoelectric substrate 21. FIGS. 3A to 3F show the case where electrodes for interconnection are formed along the entire width in the traverse direction of the element.

Finally, as shown in FIGS. 3C and 3F, the piezoelectric substrate 21 is cut in the direction parallel to the cleavage plane of the piezoelectric substrate 21 (the direction shown by the dotted line in FIG. 3C), and thus piezoelectric vibrators can be obtained.

In the process of FIG. 3C, it is preferable that cutting of the piezoelectric substrate 21 is performed by laser cutting. Laser cutting can prevent chipping on the cut plane and an increase of the surface roughness on the cut plane, unlike cutting with a dicing saw or a diamond cutter. Furthermore, laser cutting can be performed including the step of performing heating with laser and gas cooling in close proximity to the heated portion so as to grow a stress selectively in the cleavage direction. This technique can eliminate a cutting hem and reduce chipping, so that waste of the piezoelectric substrate can be reduced. For the piezoelectric element of the present invention in which the cleavage direction of the substrate corresponds to the division direction of the substrate, laser cutting is particularly suitable.

EMBODIMENT 2

In Embodiment 2, another example of a piezoelectric vibrator will be described. A piezoelectric vibrator 10a of Embodiment 2 is the same as the piezoelectric vibrator 10 described in Embodiment 1 except for the substrate, so that duplicate description will be omitted.

Figure 4A:
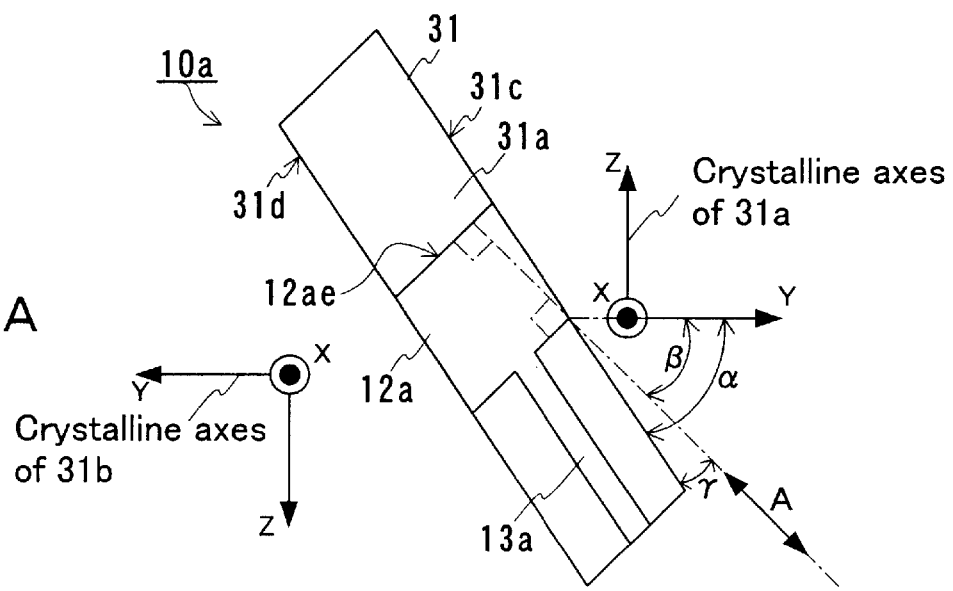
FIGS. 4A to 4C are views showing another example of a piezoelectric vibrator of the present invention.
Figure 4B:
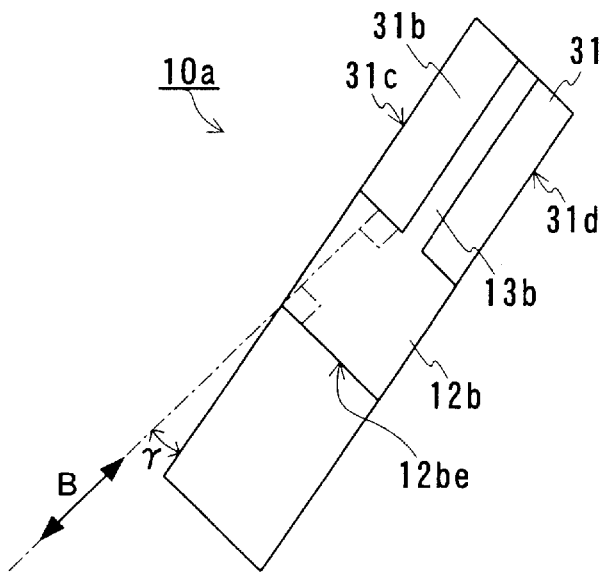
Figure 4C:
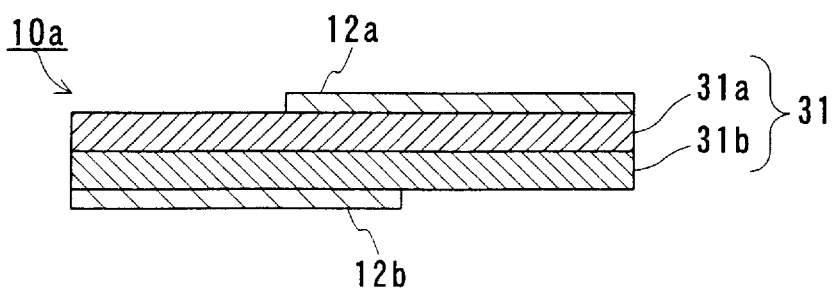

FIG. 4A is a plan view of a piezoelectric vibrator 10a of Embodiment 2 from a first principal plane side. FIG. 4B is a plan view from a second principal plane side. FIG. 4C is a cross-sectional view of the central portion of the piezoelectric vibrator. FIG. 4A also shows the directions of the crystalline axes of a first piezoelectric substrate 31a and a second piezoelectric substrate 31b.

Referring to FIGS. 4A to 4C, the piezoelectric vibrator 10a includes a piezoelectric substrate 31, an exciting electrode 12a formed on the first principal plane of the piezoelectric substrate 31 and an exciting electrode 12b formed on the second principal plane opposed to the first principal plane. The exciting electrodes 12a and 12b are connected to electrodes 13a and 13b for interconnection, respectively. In FIGS. 4A and 4B, the direction A is a direction obtained by rotating the Y-axis of the piezoelectric substrate 31a for 50° clockwise on the YZ plane.

The piezoelectric substrate 31 includes a first piezoelectric substrate 31a and a second piezoelectric substrate 31b that are stacked in such a manner that their polarization directions are opposite to each other. More specifically, for example, the first and second piezoelectric substrates 31a and 31b can be stacked in such a manner that the Y-axis and the Z-axis of the first piezoelectric substrate 31a are in the opposite directions to the Y-axis and the Z-axis of the second piezoelectric substrate 31b, respectively. The first piezoelectric substrate 31a and the second piezoelectric substrate 31b are bonded directly. In the piezoelectric vibrator of the present invention, the piezoelectric substrate 31 achieves substantially twice the resonance frequency of the piezoelectric vibrator using the piezoelectric substrate 11.

The first piezoelectric substrate 31a and the second piezoelectric substrate 31b are X plates formed of $LiTaO_3$ single crystal. Among the principal planes of the piezoelectric substrate 31, a side wall 31c and a side wall 31d opposed to the side wall 31c, at which the substrate is cut, are substantially parallel to the cleavage plane of $LiTaO_3$ single crystal. The angle α formed by the side wall 31c and the Y-axis of the piezoelectric substrate 31a, the angle β formed by the direction A and the Y-axis of the piezoelectric substrate 31a, and the angle γ formed by the side wall 31c and the direction A are the same as those described in Embodiment 1, so that duplicate description will be omitted.

The size of the piezoelectric substrate 31 is not limited to a particular size. For example, the length can be 2.0 mm, the width can be 0.10 mm, and the thickness can be 50 µm. The piezoelectric substrate 31 with a thickness of 50 µm can provide a piezoelectric vibrator having a resonance frequency of about 80 MHz. It is preferable that the side walls 31c and 31d are planes cleaved by laser irradiation.

In the conventional piezoelectric element, the surface roughness on the end face affects the characteristics of the vibrator, and therefore a vibrator of at most about 30 MHz only can be produced. On the other hand, the piezoelectric vibrator 10a allows operations at high frequency at least twice the frequency of the conventional vibrator. Furthermore, the piezoelectric vibrator 10a can solve the problem of the spurious as well as in Embodiment 1. Therefore, according to the piezoelectric vibrator 10a, a piezoelectric vibrator can suppress undesired spurious and allows operations at high frequencies.

The piezoelectric vibrator 10a can be produced in the same method as described in Embodiment 1 except that the piezoelectric substrate 11 is replaced by the piezoelectric substrate 31. The piezoelectric substrate 31 can be formed by directly bonding the first and second piezoelectric substrates 31a and 31b. More specifically, for example, the following method can be used. Two substrates are immersed in a heated sulfuric acid-hydrogen peroxide mixed solution so that the surfaces of the substrates become hydrophilic. Then, the two substrates are bonded tightly and are subjected to a heat treatment (see JP7-206600 A). Thereafter, as described above referring to FIGS. 3A to 3F, metal films are formed on the piezoelectric substrates, and the piezoelectric substrate is divided parallel to the cleavage plane.

EMBODIMENT 3

In Embodiment 3, a piezoelectric filter of the present invention will be described by way of an example of a dual mode piezoelectric filter. The same components as those of the piezoelectric vibrator 10 of Embodiment 1 bear the same reference numerals, and will not be described further.

Figure 5A:
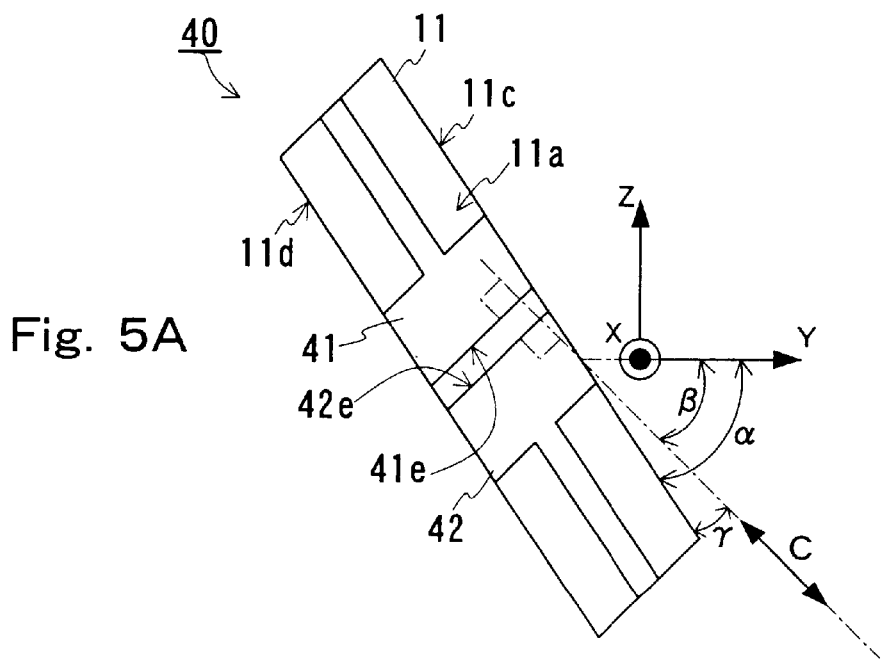
FIGS. 5A to 5C are views showing an example of a piezoelectric filter of the present invention.
Figure 5B:
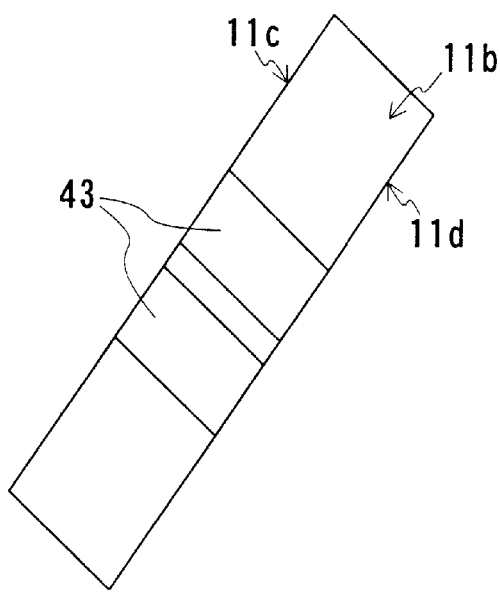

FIG. 5A is a plan view of a piezoelectric filter 40 of Embodiment 3 from a first principal plane side. FIG. 5B is a plan view from a second principal plane side. FIGS. 5A also shows the directions of the crystalline axes of a piezoelectric substrate 11.

Figure 5C:
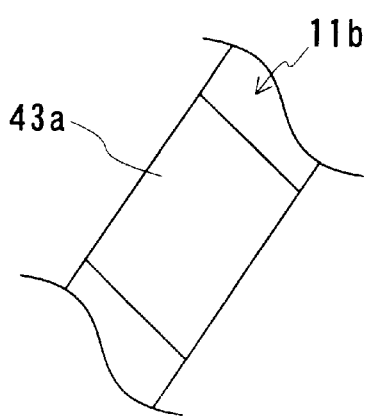

Referring to FIGS. 5A to 5C, the piezoelectric filter 40 of Embodiment 3 includes a piezoelectric substrate 11, an input electrode 41 and an output electrode 42 formed on a first principal plane 11a of the piezoelectric substrate 11, and a ground electrode 43 formed on a second principal plane 11b oppose to the first principal plane. The ground electrode 43 is formed on the second principal plane 11b in a position corresponding to the input electrode 41 and the output electrode 42. The piezoelectric filter 40 functions as a bandpass filter that passes frequencies in a certain band. The ground electrode may have a shape of a ground electrode 43a as shown in FIG. 5C. The ground electrode may be formed on the entire surface of the second principal plane 11b.

The piezoelectric substrate 11 is the same as that described in Embodiment 1, and is an X plate of $LiTaO_3$ single crystal. The principal plane 11a and the second principal plane 11b of the piezoelectric substrate 11 are an X-cut plane and a −X cut plane, respectively. Among the principal planes of the piezoelectric substrate 11, a side wall 11c and a side wall 11d opposed to the side wall 11c, at which the substrate is cut, are substantially parallel to the cleavage plane of $LiTaO_3$ single crystal. More specifically, it is preferable that the side walls 11c and 11d are the cleavage planes of the piezoelectric substrate 11 (X plate of $LiTaO_3$). In other words, it is preferable that the side walls 11c and 11d are parallel to a plane obtained by rotating the XY plane of the piezoelectric substrate 11 for 56° to 58° (57°−1° to 57°+1°) clockwise about the X-axis.

In the piezoelectric filter 40, as in Embodiment 2, the piezoelectric substrate 31 including two piezoelectric substrates that are stacked in such a manner that their polarization directions are opposite can replace the piezoelectric substrate 11.

The input electrode 41, the output electrode 42 and the ground electrode 43 can be formed of the same materials as those for the exciting electrode 12a. The input electrode 41 and the output electrode 42 have the same size and are opposed to each other. The direction of the normal line of an edge 41e of the input electrode 41 is substantially parallel to the direction of the normal line of an edge 42e of the output electrode 42. The direction of the normal line of and the edge 41e of the input electrode 41, namely, the direction C in which the input electrode 41 and the output electrode 42 are opposed (hereinafter, referred to as the opposing direction C) is nonparallel to the cleavage plane of the piezoelectric substrate 11. In order word, the opposing direction C is nonparallel to the side walls 11c and 11d.

Preferably, the direction C is a direction obtained by rotating the Y-axis of the piezoelectric substrate 11 for 47° to 56° (preferably, 48° to 52°) clockwise on the YZ plane. In other words, it is preferable that the angle γ formed by the direction C and the side wall 11c satisfies the relationship $0° < \gamma \leq 10°$ (more preferably, $5° \leq \gamma \leq 9°$).

A bandpass filter having a central frequency of about 40 MHz can be obtained by using a substrate cleaved in a direction −57° from the Y-axis having a length of 2.5 mm, a width of 0.15 mm and a thickness of 50 μm as the piezoelectric substrate 11, and using electrodes having an angle β formed by the opposing direction C and the Y-axis of the piezoelectric substrate 11 of 47°.

In the piezoelectric filter 40 of the present invention, the piezoelectric substrate 11 is cut along the cleavage direction of the crystal. Therefore, the substrate can be divided more precisely, and the surface roughness on the cut face can be minimized. Therefore, the piezoelectric filter 40 of the present invention can be produced easily, reduces insertion loss and allows operations at high frequencies.

Furthermore, in the piezoelectric filter 40, the portion where the electrodes overlap is constant in the vibration direction of the thickness shear vibration, but has an angle with respect to the vibration direction of the thickness twist vibration. For this reason, in the thickness twist vibration, the symmetry is broken, and undesired thickness twist vibration can be suppressed significantly. Furthermore, undesired vibration reflected by the side walls of the piezoelectric substrate can be absorbed by holding the end of the element with a conductive paste or the like. Thus, the present invention can provide a piezoelectric filter that hardly forms an undesired passband caused by spurious, and allows a large amount of attenuation of signals outside its frequency band.

The piezoelectric filter 40 of Embodiment 3 can be produced in the same method as described above referring to FIGS. 3A to 3F.

As described in Embodiment 1, it is preferable that the width W and the thickness H of the piezoelectric substrate 11 satisfy the relationship $2.9 \leq W/H \leq 3.1$ or $3.7 \leq W/H \leq 3.9$. With this, a piezoelectric filter with good characteristics can be obtained in which the spurious that occurs in connection with the width is sufficiently apart from the frequency band of the principal vibration.

EMBODIMENT 4

In Embodiment 4, an example of a mobile communication device of the present invention will be described.

Figure 6:
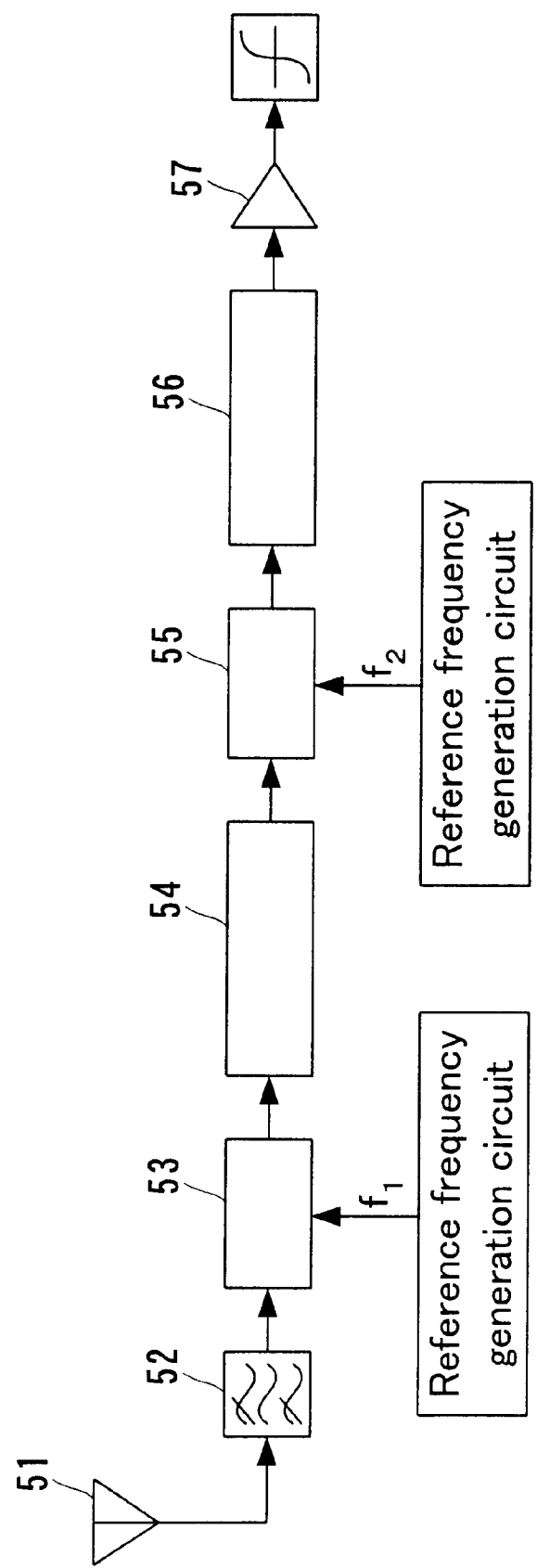
FIG. 6 is a view showing an example of the configuration of a mobile communication device of the present invention.

FIG. 6 shows a configuration diagram of a receiver circuit of a mobile communication device of Embodiment 4. Referring to FIG. 6, the mobile communication device of Embodiment 4 includes an antenna 51, a Rx filter 52, a mixer 53 and a primary IF filter 54, a mixer 55, a secondary IF filter 56, and an amplifier 57. This receiver circuit converts radio signals (Rx) received by the antenna 51 to alternating signals via the Rx filter 52, the mixer 53 and the primary IF filter 54, the mixer 55, the secondary IF filter 56, and the amplifier 57.

In the mobile communication device of the present invention, the primary IF filter 54 is the piezoelectric filter described in Embodiment 3. By using the piezoelectric filter of the present invention for the primary IF filter 54, a compact mobile communication device with high selectivity of the frequency (reduced crosstalk and interference) can be obtained.

Figure 7A:
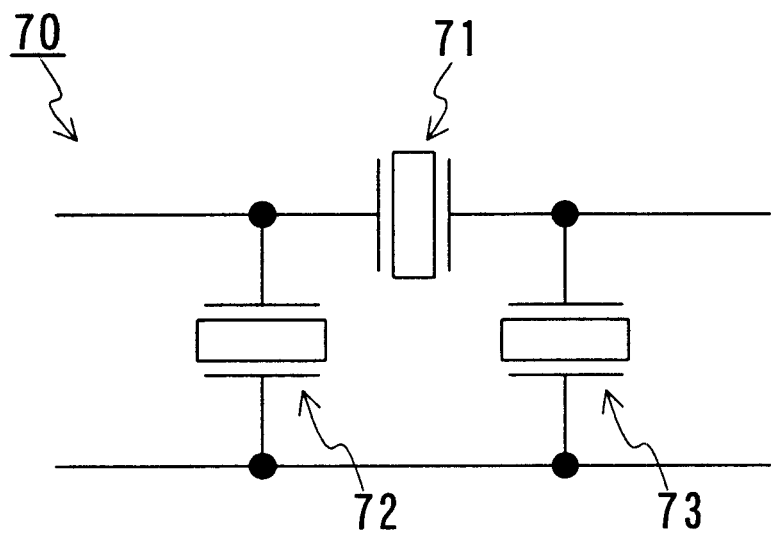
FIG. 7A is a schematic view showing an example of a filter employing the piezoelectric element of the present invention.
Figure 7B:
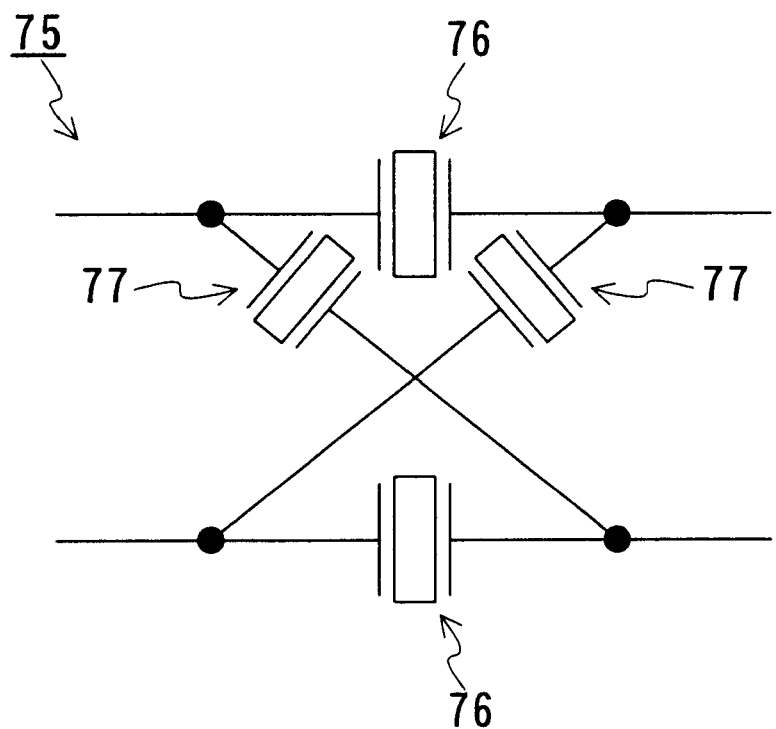
FIG. 7B is a schematic view showing another example thereof.
Figure 8:
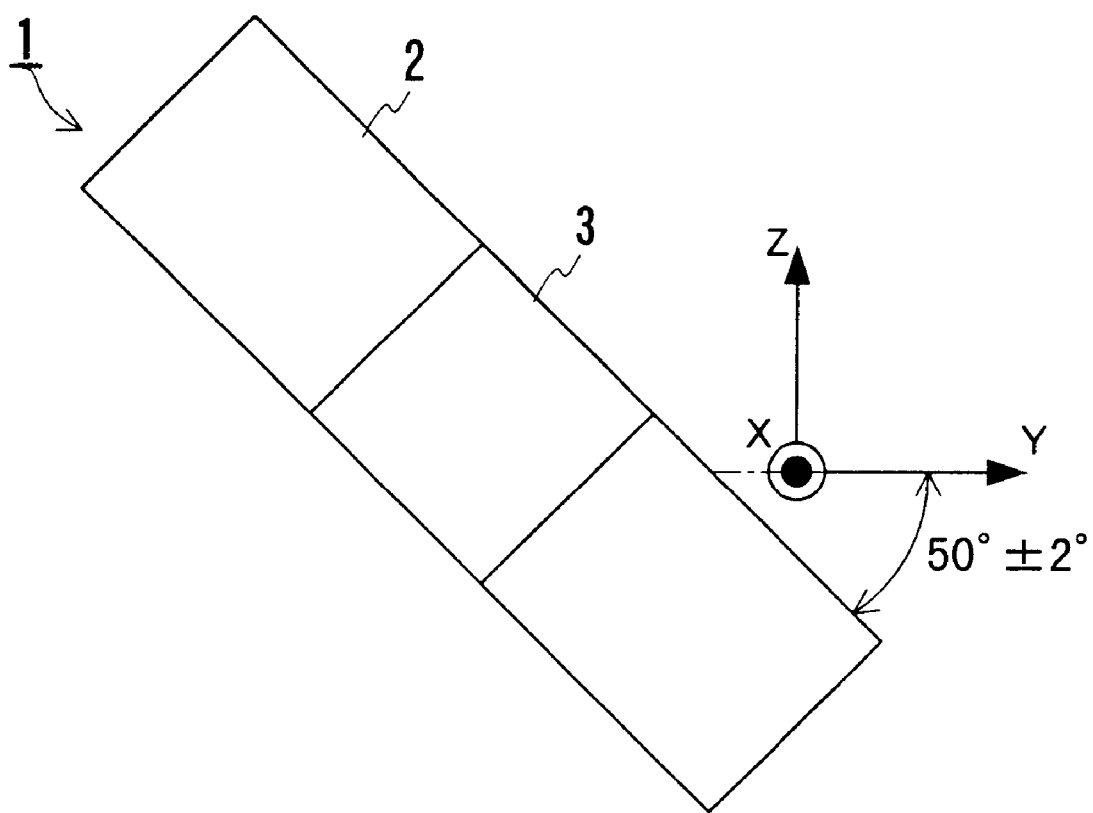
FIG. 8 is a view showing an example of a conventional piezoelectric vibrator.
Figure 9A:
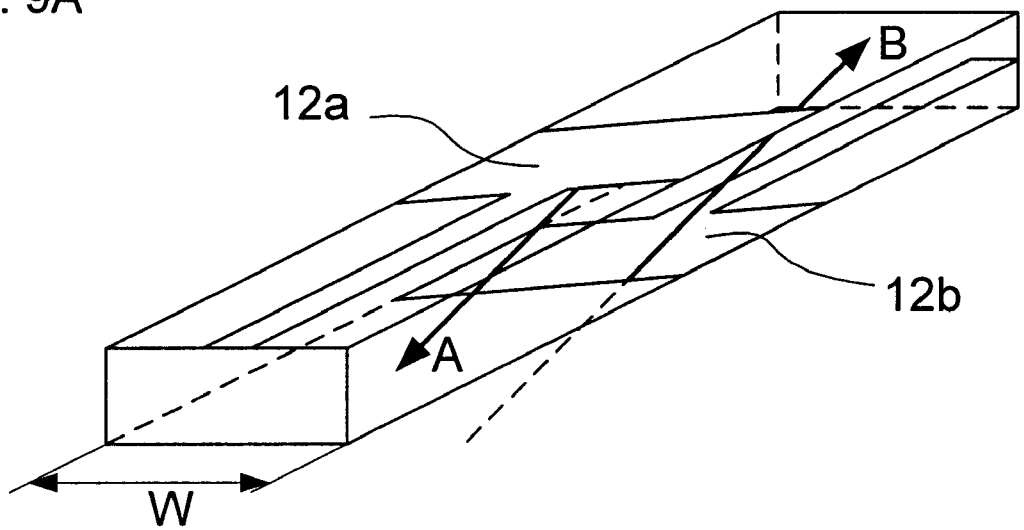
FIG. 9A is a perspective view of the piezoelectric vibrator shown in FIGS. 1A to 1C.
Figure 9B:
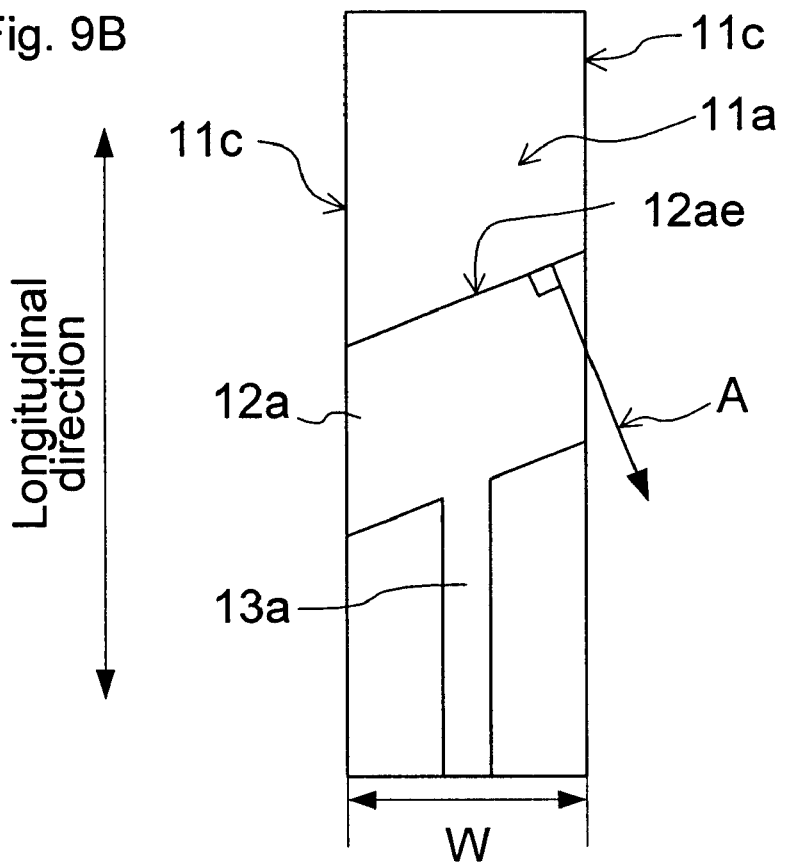
FIG. 9B is a top plan view of the piezoelectric vibrator shown in FIG. 9A.

A ladder filter or a lattice filter can be formed by using a plurality of piezoelectric vibrators of the present invention. Furthermore, a filter can be formed by using a plurality of dual mode vibrators of the present invention. FIG. 7A shows an example of a ladder filter 70, and FIG. 7B shows an example of a lattice filter 75.

The ladder-type filter 70 includes piezoelectric vibrators 71 to 73 that are connected in series and in parallel. Each of the piezoelectric vibrators 71 to 73 is a piezoelectric vibrator of the present invention with a slightly different resonance frequency from each other. The lattice-type filter 75 includes piezoelectric vibrators 76 and 77 that are connected in series and in parallel. The piezoelectric vibrators 76 and 77 are piezoelectric vibrators of the present invention with a slightly different resonance frequency from each other. According to the piezoelectric filters with this structure, a piezoelectric filter with good characteristics can be obtained in which the spurious that occurs in connection with the width of the piezoelectric substrate is sufficiently apart from the frequency band of the principal vibration.

Furthermore, when the piezoelectric vibrator described in Embodiment 1 or 2 is used as a filter for selecting a specific frequency in a mobile communication device, a compact and high-speed mobile communication device with a high operation frequency can be obtained.

The present invention has been described above by way of embodiments. However, the present invention is not limited to the above embodiments, but can be applied to other embodiments based on the technical idea of the present invention.

For example, although in the embodiments of the present invention, a strip type piezoelectric element that is obtained by cutting to a specific width in a specific direction has been described, this is only an example, and the present invention is not limited thereto. In order to obtain an effect of suppressing the spurious, it is sufficient that the vibration direction of the thickness shear vibration is nonparallel to the side wall of the piezoelectric substrate. The vibration direction is determined by the piezoelectric substrate to be used and the cut angle thereof. Therefore, if the direction in which the electrode is to be formed is changed accordingly, the same effect as in the piezoelectric elements of the above embodiments can be obtained in all the piezoelectric elements that excite thickness shear vibration.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A piezoelectric element comprising:
   a piezoelectric substrate having a shape of an elongated rectangular solid, and
   first and second exciting electrodes formed on a part of at least one principal plane selected from the group consisting of a first principal plane of the piezoelectric substrate and a second principal plane opposed to the first principal plane, wherein thickness shear vibration occurs, a vibration direction of the thickness shear vibration is nonparallel to a side wall extending in a longitudinal direction of the piezoelectric substrate, and a normal line of an edge in the longitudinal direction of the first exciting electrode and a normal line of an edge in the longitudinal direction of the second exciting electrode are parallel to each other, and are nonparallel to the side wall extending in the longitudinal direction of the piezoelectric substrate.

2. The piezoelectric element according to claim 1, wherein the first and second exciting electrodes are formed along an entire width in a traverse direction of the substrate on said at least one principal plane.

3. The piezoelectric element according to claim 2, wherein the piezoelectric substrate is formed of LiTaO$_3$ single crystal, the first exciting electrode is formed on the first principal plane, and the second exciting electrode is formed on the second principal plane.

4. The piezoelectric element according to claim 3, wherein the first and second principal planes are X planes of the piezoelectric substrate, and the side wall in the longitudinal direction is parallel to a plane obtained by rotating an XY plane of the piezoelectric substrate for 56° to 58° clockwise about an X-axis.

5. The piezoelectric element according to claim 4, wherein the direction of the normal line is a direction obtained by rotating Y-axis of the piezoelectric substrate for 47° to 56° clockwise on a YZ plane.

6. The piezoelectric element according to claim 5, wherein the width W and the thickness H of the piezoelectric substrate satisfy the relationship $2.9 \leq W/H \leq 3.1$ or $3.7 \leq W/H \leq 3.9$.

7. The piezoelectric element according to claim 6, wherein the piezoelectric substrate includes first and second piezoelectric substrates, and the first piezoelectric substrate and the second piezoelectric substrate are stacked in such a manner that their polarization directions are opposite to each other.

8. The piezoelectric element according to claim 6, wherein the side wall in the longitudinal direction is a plane cleaved by laser irradiation.

9. The piezoelectric element according to claim 2, wherein the piezoelectric substrate is formed of LiTaO$_3$ single crystal, the pair of electrodes includes an input electrode and an output electrode, the input electrode and the output electrode are formed on the first principal plane of the piezoelectric substrate, the piezoelectric element further comprises a ground electrode formed on the second principal plane, the side wall is a side wall in a longitudinal direction of the piezoelectric substrate, and a normal line of an edge of the input electrode and a normal line of an edge of the output electrode are parallel to each other and are nonparallel to the side wall in the longitudinal direction.

10. The piezoelectric element according to claim 9, wherein the first and second principal planes are X planes of the piezoelectric substrate, and the side wall of the piezoelectric substrate is parallel to a plane obtained by rotating an XY plane of the piezoelectric substrate for 56° to 58° clockwise about an X-axis.

11. The piezoelectric element according to claim 10, wherein the direction of the normal line is a direction obtained by rotating a Y-axis of the piezoelectric substrate for 47° to 56° clockwise on a YZ plane.

12. The piezoelectric element according to claim 11, wherein the width W and the thickness H of the piezoelectric substrate satisfy the relationship $2.9 \leq W/H \leq 3.1$ or $3.7 \leq W/H \leq 3.9$.

13. The piezoelectric element according to claim 12, wherein the piezoelectric substrate includes a first piezoelectric substrate and a second piezoelectric substrate, and the first piezoelectric substrate and the second piezoelectric substrate are stacked in such a manner that their polarization directions are opposite to each other.

14. The piezoelectric element according to claim 12, wherein the side wall in the longitudinal direction is a plane cleaved by laser irradiation.

15. A mobile communication device comprising the piezoelectric element according to claim 1.

* * * * *